(12) United States Patent
Rui et al.

(10) Patent No.: US 10,089,255 B2
(45) Date of Patent: Oct. 2, 2018

(54) HIGH PERFORMANCE HOST QUEUE MONITOR FOR PCIE SSD CONTROLLER

(71) Applicant: SK hynix Inc., Gyeonggi-do OT (KR)

(72) Inventors: Xianfeng Rui, Sunnyvale, CA (US); Fan Yang, San Jose, CA (US); Ryan Yu, Sunnyvale, CA (US); Ananthanarayanan Nagarajan, Palo Alto, CA (US)

(73) Assignee: SK Hynix Inc., Gyeonggi-do (KR)

( * ) Notice: Subject to any disclaimer, the term of this patent is extended or adjusted under 35 U.S.C. 154(b) by 132 days.

(21) Appl. No.: 15/219,222

(22) Filed: Jul. 25, 2016

(65) Prior Publication Data

US 2017/0024333 A1 Jan. 26, 2017

Related U.S. Application Data

(60) Provisional application No. 62/196,849, filed on Jul. 24, 2015.

(51) Int. Cl.
  G06F 13/16 (2006.01)
  G06F 13/42 (2006.01)
  G11C 16/04 (2006.01)

(52) U.S. Cl.
  CPC ...... *G06F 13/1642* (2013.01); *G06F 13/4282* (2013.01); *G11C 16/0483* (2013.01); *G06F 2213/0026* (2013.01)

(58) Field of Classification Search
  CPC ............ G06F 13/1642; G06F 13/4282; G06F 2213/0026; G11C 16/0483
  See application file for complete search history.

(56) References Cited

U.S. PATENT DOCUMENTS

| | | | | |
|---|---|---|---|---|
| 5,367,643 | A * | 11/1994 | Chang | G06F 5/06 370/412 |
| 6,501,757 | B1 * | 12/2002 | Kamaraj | H04L 12/5601 370/395.41 |
| 2004/0123013 | A1 * | 6/2004 | Clayton | G06F 11/1004 710/310 |
| 2007/0033289 | A1 * | 2/2007 | Nuyttens | H04N 7/181 709/230 |
| 2014/0068218 | A1 | 3/2014 | Iemura | |
| 2015/0160886 | A1 | 6/2015 | Hoglund et al. | |

* cited by examiner

*Primary Examiner* — Henry Tsai
*Assistant Examiner* — John B Roche
(74) *Attorney, Agent, or Firm* — IP & T Group LLP (57) ABSTRACT

Memory systems may include a plurality of queues, a queue ready indicator suitable for grouping the plurality of queues into a predefined number of queue ranges, each queue range having associated with it a queue range ready signal, and setting a queue range ready signal to ready when each queue in the queue range associated with the queue range ready signal is ready for processing, and a queue process sequencer suitable for determining a queue range ready for processing based on the queue range ready signals, and processing a queue within the queue range determined to be ready for processing.

20 Claims, 7 Drawing Sheets

HIGH PERFORMANCE HOST QUEUE MONITOR FOR PCIE SSD CONTROLLER

CROSS-REFERENCE TO RELATED APPLICATIONS

This application claims the benefit of U.S. Provisional Application No. 62/196,849 filed Jul. 24, 2015, the entire contents of which are incorporated herein by reference.

BACKGROUND

1. Field

Exemplary embodiments of the present disclosure relate to a memory system and an operating method thereof.

2. Description of the Related Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device of the portable electronic devices.

Data storage devices using memory devices provide excellent stability, durability, high information access speed, and low power consumption, since they have no moving parts. Examples of data storage devices having such advantages include universal serial bus (USB) memory devices, memory cards having various interfaces, and solid state drives (SSD).

Host interfaces are introduced into SSD controllers which are capable of supporting a large number of host queues. There exists a need for improved queue processing and queue management in memory devices.

SUMMARY

Aspects of the invention include memory systems, the memory systems may include a plurality of queues, a queue ready indicator suitable for grouping the plurality of queues into a predefined number of queue ranges, each queue range having associated with it a queue range ready signal, and setting a queue range ready signal to ready when each queue in the queue range associated with the queue range ready signal is ready for processing, and a queue process sequencer suitable for determining a queue range ready for processing based on the queue range ready signals, and processing a queue within the queue range determined to be ready for processing.

Further aspects of the invention include methods. The methods may include grouping, with a queue ready indicator, a plurality of queues into a predefined number of queue ranges, each queue range having associated with it a queue range ready signal, setting, with the queue ready indicator, a queue range ready signal to ready when each queue in the queue range associated with the queue range ready signal is ready for processing, determining, with a queue process sequencer, a queue range ready for processing based on the queue range ready signals, and processing a queue within the queue range determined to be ready for processing.

Additional aspects of the invention include memory devices. The memory devices may include a plurality of queues, a queue ready indicator configured to group the plurality of queues into a predefined number of queue ranges, each queue range having associated with it a queue range ready signal, and set a queue range ready signal to ready when each queue in the queue range associated with the queue range ready signal is ready for processing, and a queue process sequencer configured to determine a queue range ready for processing based on the queue range ready signals, and process a queue within the queue range determined to be ready for processing.

DETAILED DESCRIPTION

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention can be implemented in numerous ways, including as a process; an apparatus; a system; a composition of matter; a computer program product embodied on a computer readable storage medium; and/or a processor, such as a processor suitable for executing instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being suitable for performing a task may be implemented as a general component that is temporarily suitable for performing the task at a given time or a specific component that is manufactured to perform the task. As used herein, the term 'processor' refers to one or more devices, circuits, and/or processing cores suitable for processing data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
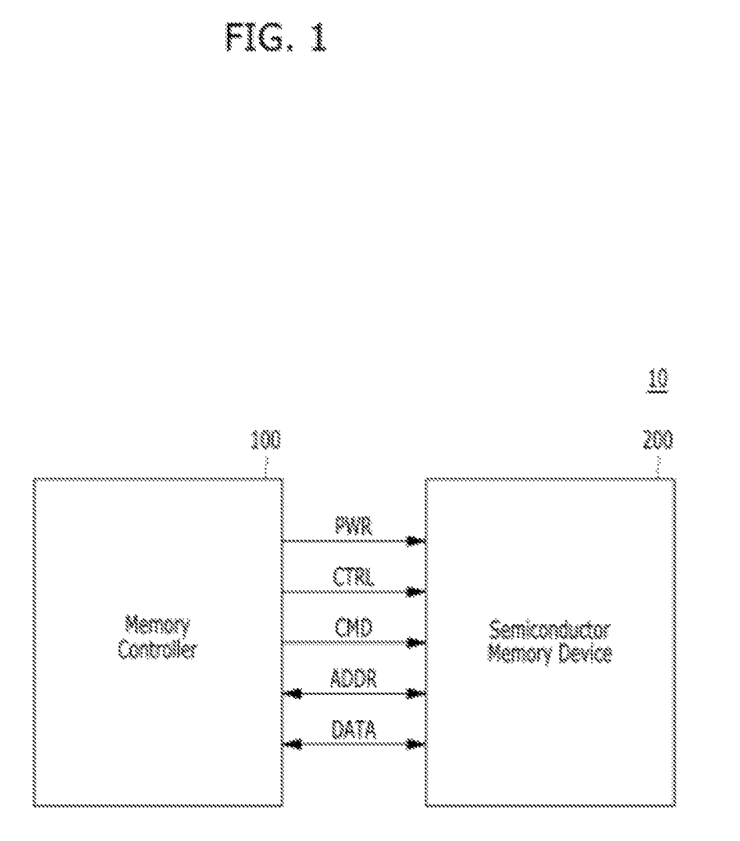
FIG. 1 is a block diagram schematically illustrating a memory system in accordance with an embodiment of the present invention.

FIG. 1 is a block diagram schematically illustrating a memory system 10 in accordance with an embodiment of the present invention.

Referring FIG. 1, the memory system 10 may include a memory controller 100 and a semiconductor memory device 200.

The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 and the semiconductor memory device 200 may be integrated in a single semiconductor device. For example, the memory controller 100 and the semiconductor memory device 200 may be integrated in a single semiconductor device such as a solid state drive (SSD). The solid state drive may include a storage device for storing data therein. When the semiconductor memory system 10 is used in an SSD, operation speed of a host (not shown) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated in a single semiconductor device to configure a memory card such as a PC card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the memory system 10 may be provided as one of various elements including an electronic device such as a computer, an ultra-mobile PC (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, a radio-frequency identification (RFID) device, or elements devices of a computing system.

Figure 2:
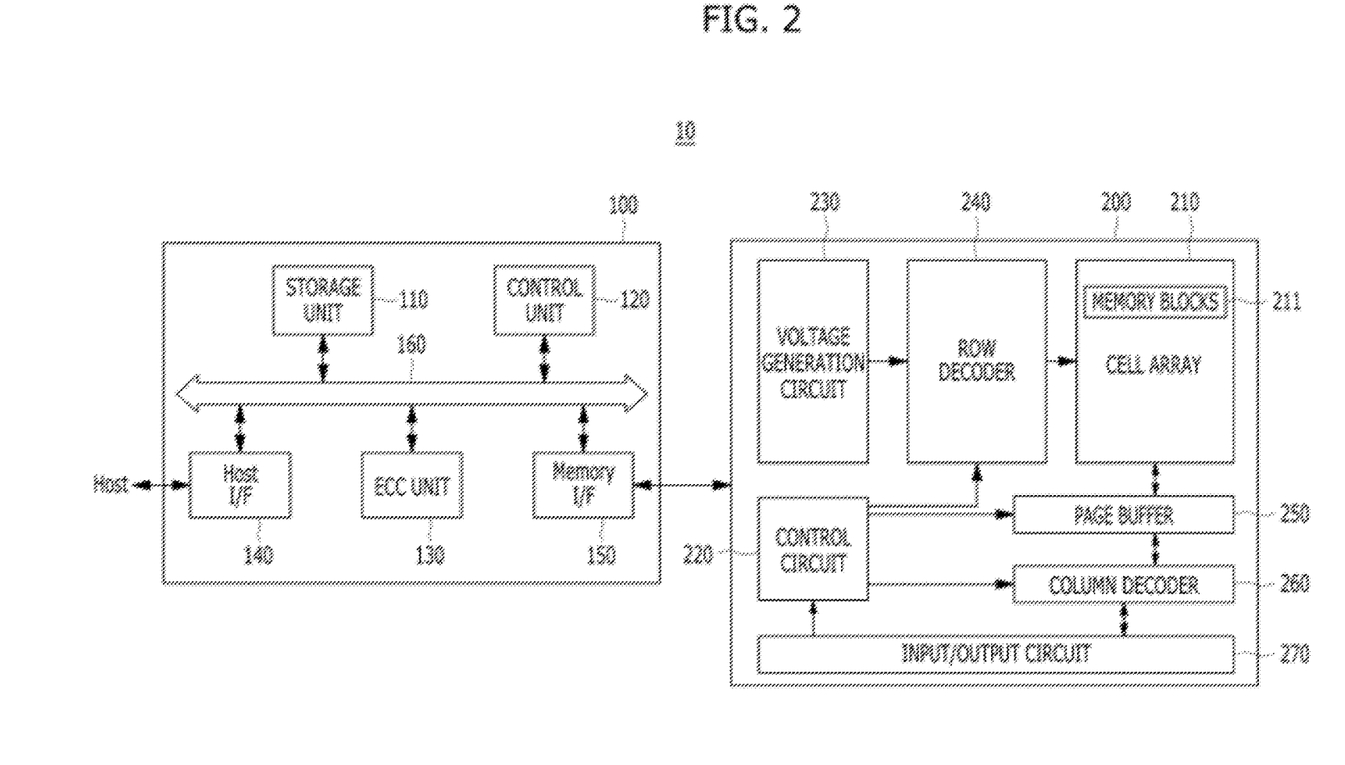
FIG. 2 is a block diagram illustrating a memory system in accordance with an embodiment of the present invention.

FIG. 2 is a detailed block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device, and in particular, store data to be accessed by the host device.

The host device may be implemented with any one of various kinds of electronic devices. In some embodiments, the host device may include an electronic device such as a desktop computer, a workstation, a three-dimensional (3D) television, a smart television, a digital audio recorder, a digital audio player, a digital picture recorder, a digital picture player, a digital video recorder and a digital video player. In some embodiments, the host device may include a portable electronic device such as a mobile phone, a smart phone, an e-book, an MP3 player, a portable multimedia player (PMP), and a portable game player.

The memory device 200 may store data to be accessed by the host device.

The memory device 200 may be implemented with a volatile memory device such as a dynamic random access memory (DRAM) and a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM) and a resistive RAM (RRAM).

The controller 100 may control storage of data in the memory device 200. For example, the controller 100 may control the memory device 200 in response to a request from the host device. The controller 100 may provide the data read from the memory device 200, to the host device, and store the data provided from the host device into the memory device 200.

The controller 100 may include a storage unit 110, a control unit 120, the error correction code (ECC) unit 130, a host interface 140 and a memory interface 150, which are coupled through a bus 160.

The storage unit 110 may serve as a working memory of the memory system 10 and the controller 100, and store data for driving the memory system 10 and the controller 100. When the controller 100 controls operations of the memory device 200, the storage unit 110 may store data used by the controller 100 and the memory device 200 for such operations as read, write, program and erase operations.

The storage unit 110 may be implemented with a volatile memory. The storage unit 110 may be implemented with a static random access memory (SRAM) or a dynamic random access memory (DRAM). As described above, the storage unit 110 may store data used by the host device in the memory device 200 for the read and write operations. To store the data, the storage unit 110 may include a program memory, a data memory, a write buffer, a read buffer, a map buffer, and so forth.

The control unit 120 may control general operations of the memory system 10, and a write operation or a read operation for the memory device 200, in response to a write request or a read request from the host device. The control unit 120 may drive firmware, which is referred to as a flash translation layer (FTL), to control the general operations of the memory system 10. For example, the FTL may perform operations such as logical to physical (L2P) mapping, wear leveling, garbage collection, and bad block handling. The L2P mapping is known as logical block addressing (LBA).

The ECC unit 130 may detect and correct errors in the data read from the memory device 200 during the read operation. The ECC unit 130 may not correct error bits when the number of the error bits is greater than or equal to a threshold number of correctable error bits, and may output an error correction fail signal indicating failure in correcting the error bits.

In some embodiments, the ECC unit 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), a Block coded modulation (BCM), and so on. The ECC unit 130 may include all circuits, systems or devices for the error correction operation.

The host interface 140 may communicate with the host device through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the CPU 120. When the memory device 200 is a flash memory such as a NAND flash memory, the memory interface 150 may generate control signals for the memory and process data under the control of the CPU 120.

The memory device 200 may include a memory cell array 210, a control circuit 220, a voltage generation circuit 230, a row decoder 240, a page buffer 250, a column decoder 260, and an input/output circuit 270. The memory cell array 210 may include a plurality of memory blocks 211 and may store data therein. The voltage generation circuit 230, the row decoder 240, the page buffer 250, the column decoder 260 and the input/output circuit 270 form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages having various levels. For example, in an erase operation, the voltage generation circuit 230 may generate operation voltages having various levels such as an erase voltage and a pass voltage.

The row decoder 240 may be connected to the voltage generation circuit 230, and the plurality of memory blocks 211. The row decoder 240 may select at least one memory block among the plurality of memory blocks 211 in response to a row address RADD generated by the control circuit 220, and transmit operation voltages supplied from the voltage generation circuit 230 to the selected memory blocks among the plurality of memory blocks 211.

The page buffer 250 is connected to the memory cell array 210 through bit lines BL (not shown). The page buffer 250 may precharge the bit lines BL with a positive voltage, transmit/receive data to/from a selected memory block in program and read operations, or temporarily store transmitted data, in response to a page buffer control signal generated by the control circuit 220.

The column decoder 260 may transmit/receive data to/from the page buffer 250 or transmit/receive data to/from the input/output circuit 270.

The input/output circuit 270 may transmit, to the control circuit 220, a command and an address, transmitted from an external device (e.g., the memory controller 100), transmit data from the external device to the column decoder 260, or output data from the column decoder 260 to the external device, through the input/output circuit 270.

The control circuit 220 may control the peripheral circuit in response to the command and the address.

Figure 3:
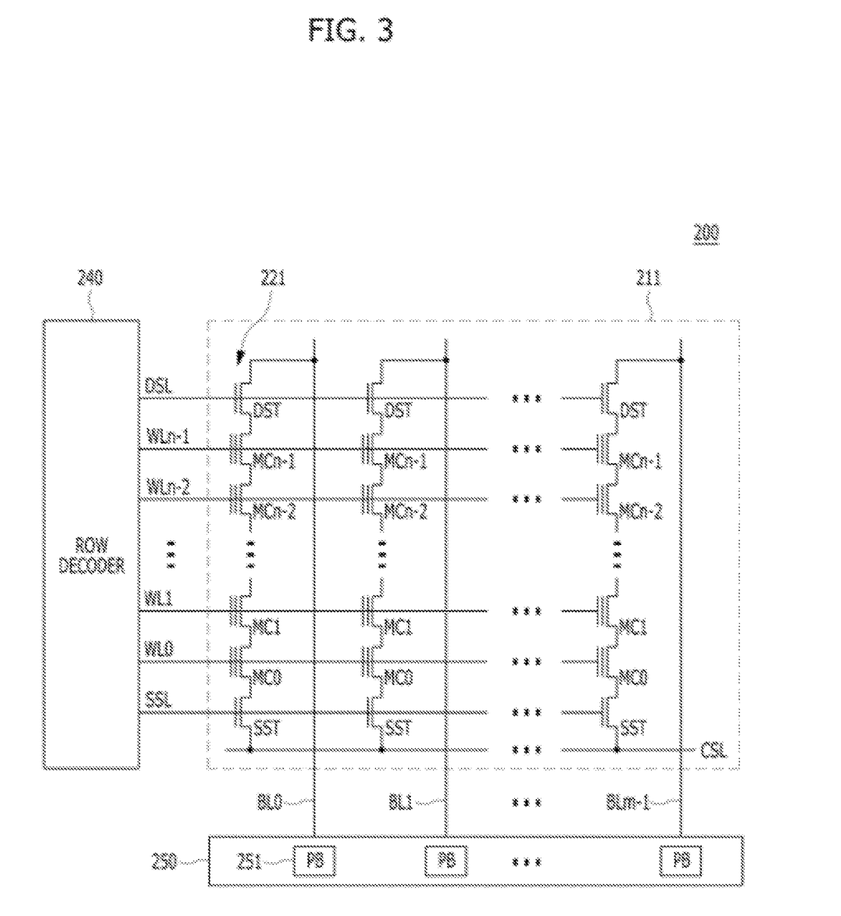
FIG. 3 is a circuit diagram illustrating a memory block of a memory device in accordance with an embodiment of the present invention.

FIG. 3 is a circuit diagram illustrating a memory block of a semiconductor memory device in accordance with an embodiment of the present invention. For example, a memory block of FIG. 3 may be the memory blocks 211 of the memory cell array 200 shown in FIG. 2.

Referring to FIG. 3, the memory blocks 211 may include a plurality of cell strings 221 coupled to bit lines BL0 to BLm−1, respectively. The cell string of each column may include one or more drain selection transistors DST and one or more source selection transistors SST. A plurality of memory cells or memory cell transistors may be serially coupled between the selection transistors DST and SST. The DSTs of the cell strings 221 are electrically coupled by a drain select line (DSL), and the SSTs of the cell strings 221 are electrically coupled by a source select line (SSL). The sources of the SSTs are electrically coupled by a column select line (CSL). Each of the memory cells MC0 to MCn−1 may be formed of a multi-level cell (MLC) storing data information of multiple bits in each cell. Each group of memory cells MC0, MC1 . . . MCn−2, and MCn−1 extending across cell strings 221 are electrically coupled by corresponding word lines WL0, WL1 . . ., WLn−2, and WLn−1, respectively, as shown in FIG. 3. The cell strings 221 may be electrically coupled to the corresponding bit lines BL0 to BLm−1, respectively, which in turn may be electrically coupled to page buffers 251, respectively. The row decoder 240 communicates with the cell strings 221 of the memory blocks 211 through the DSL, SSL, and word lines WL0 to WLn−1.

In some embodiments, the memory blocks 211 may include a NAND-type flash memory cell. However, the memory blocks 211 are not limited to the NAND flash memory, but may include NOR-type flash memory, hybrid flash memory in which two or more types of memory cells are combined, and one-NAND flash memory in which a controller is embedded inside a memory chip.

As a high throughput and performance-scaling standard, PCI Express (PCIe) provides optimized solutions for NAND flash memory as a storage interface. Host interfaces above PCIe are introduced into SSD controller designs to maximize performance, such as NVMe, SOP, etc. These interfaces have the capability to support a large number of host queues. For example, NVMe can support up to 65536 host submission queues (SQ) and completion queues (CQ). More host queues may improve performance and latency, but monitoring all these queues and performing arbitration creates large overhead and latency to the SSD controller. Disclosed herein are examples of a high performance host queue monitoring scheme to minimize latency while maintaining flexibility to support multiple arbitration mechanisms.

Figure 4:
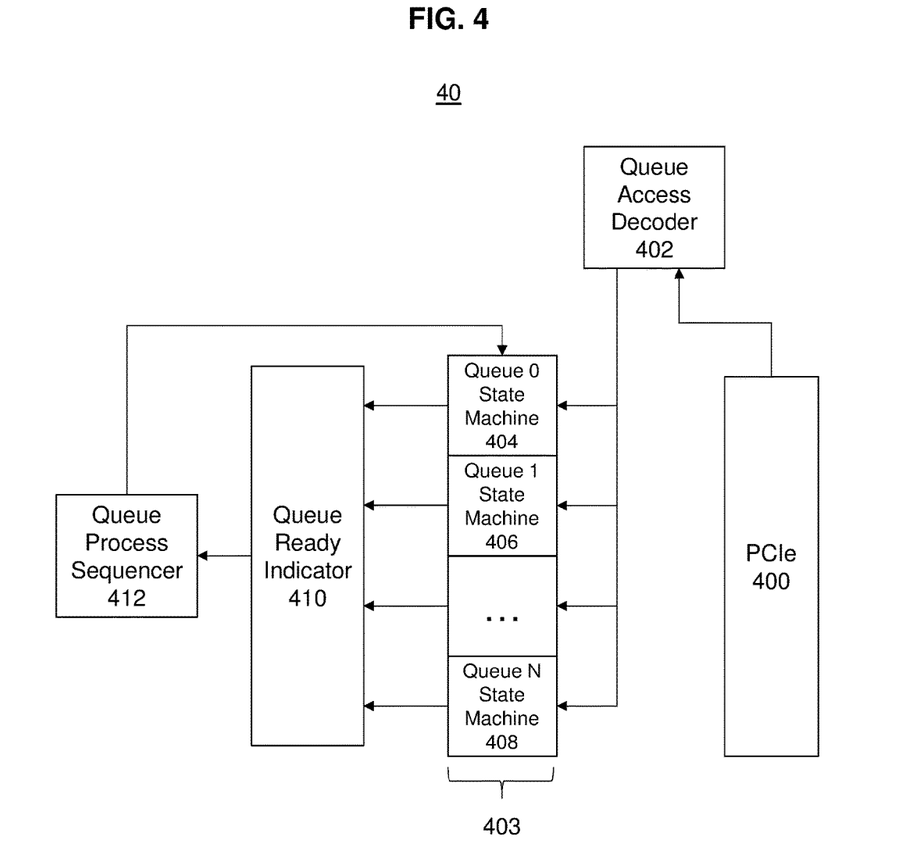
FIG. 4 is a diagram of an example queue monitoring system according to aspects of the invention.

Referring to FIG. 4, a diagram of a host queue monitor system 40 is shown. The system 40 may include a PCIe bus 400, a queue access decoder 402, a plurality of queue state machines 403 (e.g., queue 0 state machine 404, queue 1 state machine 406, . . . , queue N state machine 408, etc., 'N' representing the total number of queue state machines minus 1 in the example shown), a queue ready indicator 410, and a queue process sequencer 412.

The PCIe 400 may issue commands to access the base address register (BAR). The queue access decoder 402 may be configured to decode the PCIe BAR access commands based on the BAR base addresses and map the commands to the correct queue state machine to which the command applies. The plurality of queue state machines 403 may be each associated with a queue, may indicate the current queue status and activate the queue ready indicator 410 as is described below. The queue ready indicator 410 may provide a network to consolidate the queue ready signals from the queue state machines 403 and provide indications to the queue process sequencer 412. The queue process sequencer 412 may receive requests from the queue ready indicator 410, perform arbitration, and process active queues.

For host protocols over PCIe, BARs are the locations for the host to operate and manage host queues. For example, in the case of NVMe, doorbells (e.g., PCIe memory write commands) to the device memory pointed by the BAR are written to inform the devices of the number of new entries that are inserted into SQ or consumed in CQ. The queue access decoder 402 may be configured to qualify PCIe transactions to host queues and filter out transactions not related to queue management. The queue access decoder 402 may also be configured to map the address to the corresponding queue to which the transaction applies and send a request to the corresponding queue state machine to update the queue state. Thus, the plurality of queue state machines 403 may be configured such that a portion of the plurality of queue state machines 403 are designated for SQs and a portion of the plurality of queue state machines 403 are designated for CQs.

Figure 5:
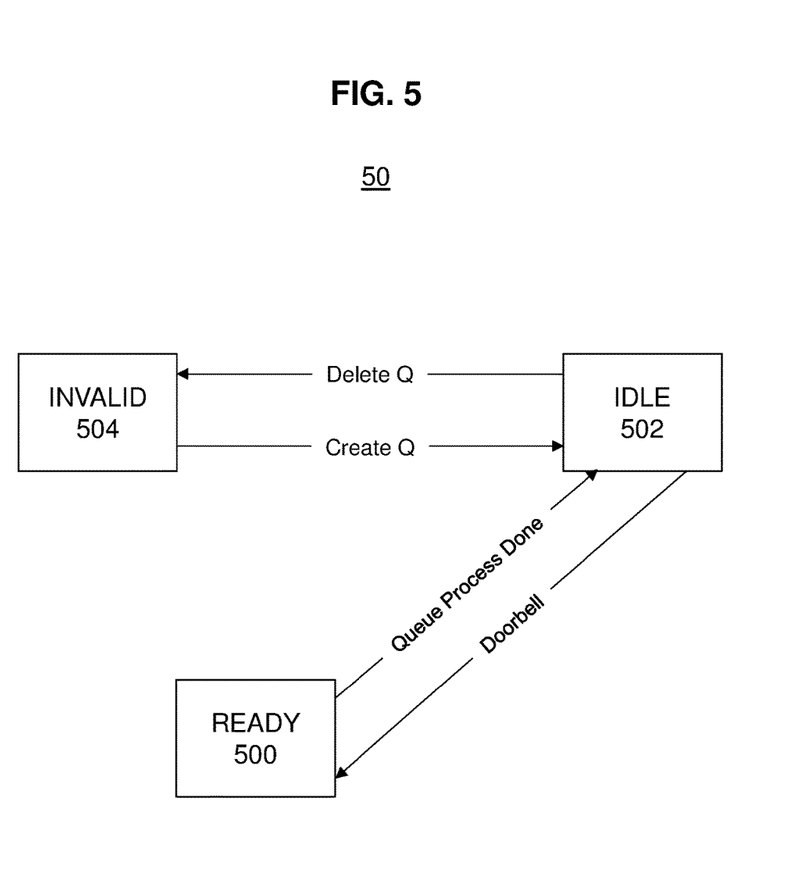
FIG. 5 is a diagram of example state transitions in accordance with aspects of the invention.

Referring next to FIG. 5, a diagram 50 of queue state machine state transitions between a ready state 500, an idle state 502, and an invalid state 504 is shown. If a queue state machine receives a request from the queue access decoder 402, it will go into the READY state 500 and inform the queue ready indicator 410. It will go back into the IDLE state 502 after the queue process sequencer 412 finishes processing the corresponding host queue. For example, the queue process sequencer 412 may fetch commands from a SQ when there are outstanding commands in this queue, and transitions the queue state machine of that SQ into the IDLE state 502. The state machine is only available to accept doorbells after the queue is created ("create Q"). It will go into the INVALID state 504 if a delete Q command is received.

Figure 6:
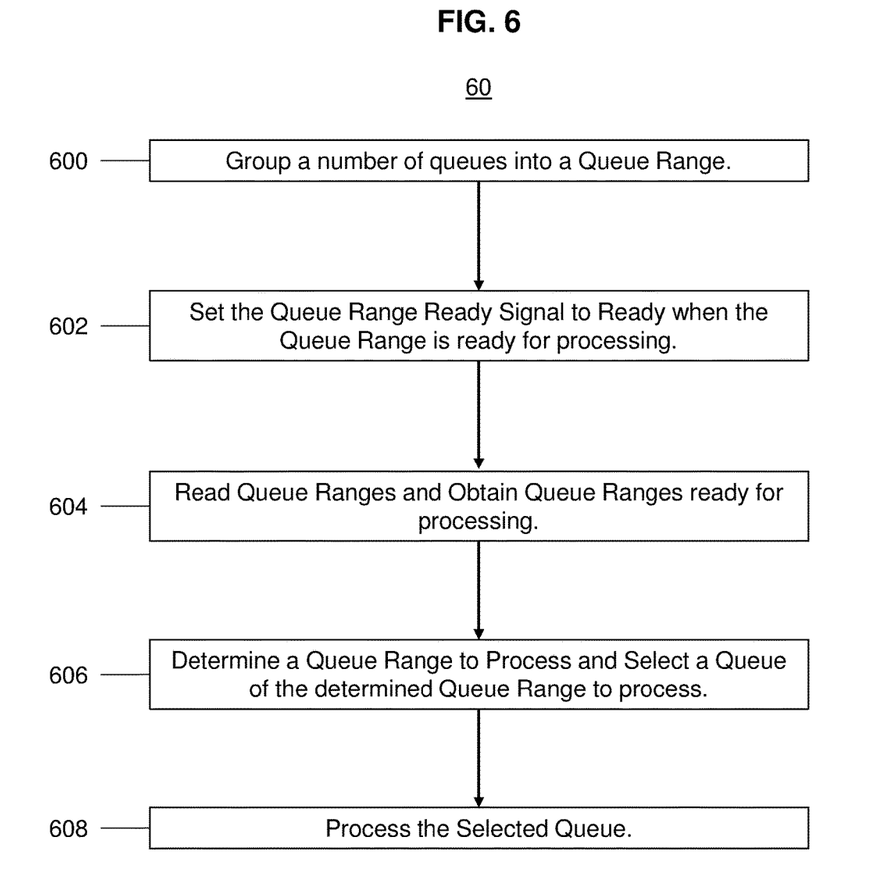
FIG. 6 is a flowchart of steps in a method for queue monitoring and management in accordance with aspects of the invention.

Referring next to FIG. 6, a flowchart 60 of steps for queue management is shown. At step 600, a predefined number of queues are grouped into a predefined number of queue range. The number of queues may be grouped into a queue range by the queue ready indicator 410. Although the term "queue" is used, the grouping of step 600 may also group the queue state machines as each queue state machine may be associated with one of the plurality of queues, and/or group the queue ready signals generated by the queue state machines. While each queue state machine of the plurality of queue state machines 403 can provide one ready signal, there could be thousands of ready signals if the controller needs to support large number of queues. To handle large number of queues, a hierarchical topology to pass the ready signals to queue process sequencer 412 is disclosed herein.

Figure 7:
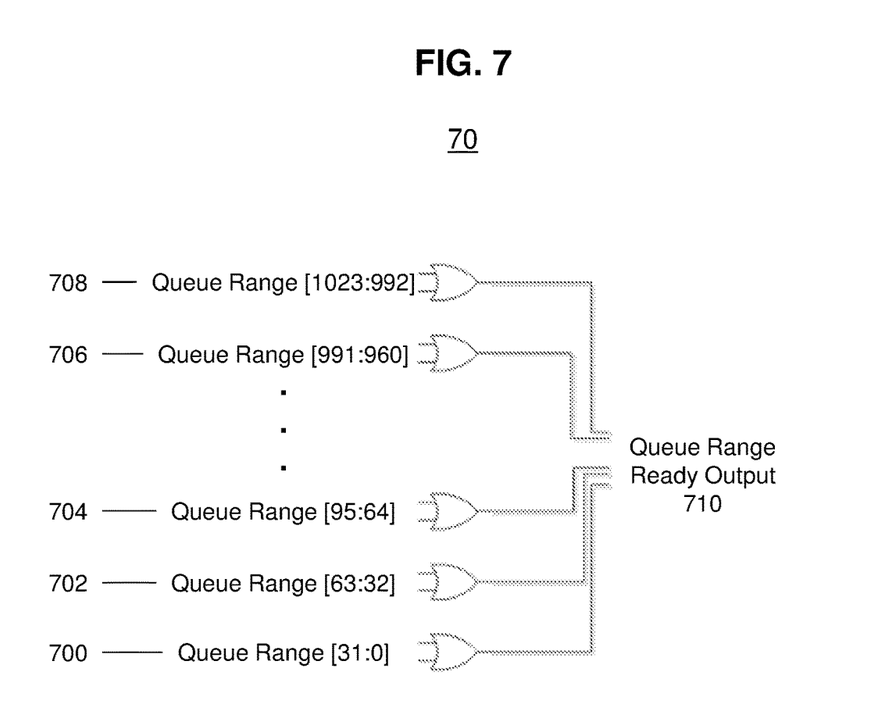
FIG. 7 is a diagram of queue ranges according to aspects of the invention.

FIG. 7 is an example diagram 70 of a queue ready indicator. The queue ready indicator may use a tree search style algorithm, and can reduce the number of operations of identifying which queues have outstanding commands significantly. It groups a predefined number of queue ready signals together. For example, the number of queues in one group can be 32 or 64, which is a typical number of AHB/AXI protocol, although those of skill in the art will recognize other suitable numbers of queues to be grouped from the disclosure herein. FIG. 7 shows an example topology of 1024 queues implementation with 32 bits AHB/AXI bus. Queue range 700 is for queues 0-31, queue range 702 is for queues 32-63, queue range 704 is for queue range 64-95, queue range 706 is for queues 960-991, and queue range 708 is for queues 992-1023, with the queue ranges between queue range 704 and 706 being omitted for ease of description. For more than 1024 queues, for example, one more level is needed to combine ready signals of multiple queue range signals. For example, three levels of logic can support up to 32768 queues.

At step 602, the queue range ready signal is set to ready when the queue range is ready for processing. Each queue range may have a queue range ready signal associated with it. For example, the queue range ready signal may be set to ready by the queue ready indicator 410. The queue range ready signal may be set to ready when each of the queues in the queue range are ready for processing. For example, if each queue in queue range 700 is ready for processing, then the queue range ready signal for queue range 700 may be set to ready and the range ready signal may be output at 710. Alternatively, if all the queues in queue range 702 are ready except for one queue (e.g., queue 63), then the queue range ready signal for queue range 702 is not set to ready and no ready signal is output such that the queue range 702 is not processed until all queues in the queue range 702 are ready.

At step 604, the queue range ready signals are read and the queue ranges ready for processing are obtained. For example, the queue range ready signals may be stored by the queue ready indicator 410 and the range ready signals may be read and the queue ranges ready for processing may be obtained by the queue process sequences 412. The queue process sequencer 412 may be an embedded processor with AHB/AXI bus. Both queue range ready signals and queue ready signals (ready signals for each individual queue) may be accessible by the queue process sequencer 412 (e.g., via output 710).

At step 606, a queue range to process is determined and a queue of the determined queue range is selected to process, and at step 608, the selected queue is processed. The queue range may be determined and the queue may be selected by the queue process sequencer 412. The selected queue may be processed by the queue process sequencer 412. The determination and selection processes may be set (in firmware, for example) and performed by various arbitration mechanisms, such as round robin and/or weighted round robin, and the firmware may support multiple host protocols.

For illustration purposes, two parameters are defined below.

N=number of hierarchies in the queue ready indicator 410.

M=bus width.

The maximum number of queues supported in a system=$M^N$.

With previous search algorithms, to support $M^N$ queues, the sequencer needs to read the queue status up to $M^N$ time to locate the queue for processing. Thus, the maximum number of operations is $X=M^N$.

However, with the queue monitoring system disclosed herein, the sequencer 412 only reads M bits of every hierarchy and searches these M bits of the hierarchy to determine which branch to perform the next search level. Thus, the maximum number of total operations is $Y=N+M*N$.

For example, in a system with 1024 queues, N is 2 and M is 32. Thus, previous systems have a maximum number of operations of $X=1024$, while the monitoring systems disclosed herein have a maximum number of operations of $Y=66$. Similarly, for 32768 queues, N is 3 and M is 32. Thus, X is 32768, while Y is 99.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A memory system, comprising:
   a plurality of queues;
   a queue ready indicator suitable for:
      grouping the plurality of queues into a predefined number of queue ranges, each queue of the plurality of queues being placed in a single queue range of the predefined number of queue ranges, each queue range having associated with it a queue range ready signal; and
      setting a queue range ready signal to ready when all queues in the queue range associated with the queue range ready signal are ready for processing; and
   a queue process sequencer suitable for:
      determining a queue range ready for processing based on the queue range ready signals; and
      processing a queue within the queue range determined to be ready for processing.

2. The memory system of claim 1, wherein the queue process sequencer is further suitable for transitioning a queue state machine associated with the processed queue to an idle state.

3. The memory system of claim 1, further comprising a queue access decoder suitable for receiving transactions from a PCIe bus.

4. The memory system of claim 3, wherein the queue access decoder is further suitable for filtering out transactions not related to queue management.

5. The memory system of claim 1, further comprising a plurality of queue state machines, each queue state machine being associated with one of the plurality of queues.

6. The memory system of claim 1, wherein a number of queues in each queue range is 32.

7. The memory system of claim 1, wherein a number of queues in each queue range is 64.

8. A method, comprising:
   grouping, with a queue ready indicator, a plurality of queues into a predefined number of queue ranges, each queue of the plurality of queues being placed in a single queue range of the predefined number of queue ranges, each queue range having associated with it a queue range ready signal;
   setting, with the queue ready indicator, a queue range ready signal to ready when all queues in the queue range associated with the queue range ready signal are ready for processing;
   determining, with a queue process sequencer, a queue range ready for processing based on the queue range ready signals; and
   processing a queue within the queue range determined to be ready for processing.

9. The method of claim 8, further comprising transitioning a queue state machine associated with the processed queue to an idle state.

10. The method of claim 8, further comprising receiving, with a queue access decoder, transactions from a PCIe bus.

11. The method of claim 10, further comprising filtering, with the queue access decoder, transactions not related to queue management.

12. The method of claim 8, further comprising a plurality of queue state machines, each queue state machine being associated with one of the plurality of queues.

13. The method of claim 8, wherein a number of queues in each queue range is 32.

14. The method of claim 8, wherein a number of queues in each queue range is 64.

15. A memory device, comprising:
   a plurality of queues;
   a queue ready indicator configured to:
      group the plurality of queues into a predefined number of queue ranges, each queue of the plurality of queues being placed in a single queue range of the predefined number of queue ranges, each queue range having associated with it a queue range ready signal; and
      set a queue range ready signal to ready when all queues in the queue range associated with the queue range ready signal are ready for processing; and
   a queue process sequencer configured to:
      determine a queue range ready for processing based on the queue range ready signals; and
      process a queue within the queue range determined to be ready for processing.

16. The memory device of claim 15, wherein the queue process sequencer is further configured to transition a queue state machine associated with the processed queue to an idle state.

17. The memory device of claim 15, further comprising a queue access decoder configured to receive transactions from a PCIe bus.

18. The memory device of claim 17, wherein the queue access decoder is further configured to filter out transactions not related to queue management.

19. The memory device of claim 15, further comprising a plurality of queue state machines, each queue state machine being associated with one of the plurality of queues.

20. The memory device of claim 15, wherein a number of queues in each queue range is 32.

* * * * *